United States Patent
Nguyen

(10) Patent No.: US 9,662,259 B1
(45) Date of Patent: May 30, 2017

(54) ANTI-ACCOMMODATION PARESIS APPARATUS

(71) Applicant: Andrew Nguyen, Huntington Beach, CA (US)

(72) Inventor: Andrew Nguyen, Huntington Beach, CA (US)

( * ) Notice: Subject to any disclaimer, the term of this patent is extended or adjusted under 35 U.S.C. 154(b) by 0 days.

(21) Appl. No.: 15/041,579

(22) Filed: Feb. 11, 2016

(51) Int. Cl.
- *G06F 1/16* (2006.01)
- *A61H 1/00* (2006.01)
- *H05K 5/02* (2006.01)

(52) U.S. Cl.
CPC .......... *A61H 1/005* (2013.01); *G06F 1/1601* (2013.01); *H05K 5/0234* (2013.01)

(58) Field of Classification Search
CPC ........ G06F 1/1675; G06F 3/011; G06F 3/012; G06F 3/0304; G06F 1/1601; G06F 1/162; G06F 1/1681; G06F 2200/1612; G06F 3/013; G06F 3/0362; G06F 1/1616; G06F 1/1679; G06F 1/1683; G06F 1/16; A61H 1/005; H05K 5/0234; F16M 11/10; F16M 2200/08; F16M 11/24
USPC ............ 361/679.22, 679.26, 679.27, 679.21, 361/679.05; 248/917–924
See application file for complete search history.

(56) References Cited

U.S. PATENT DOCUMENTS

| | | | |
|---|---|---|---|
| 2008/0158801 A1* | 7/2008 | Mathews | A61H 5/00 361/679.07 |
| 2015/0248144 A1* | 9/2015 | Hong | G06F 1/1675 361/679.27 |

* cited by examiner

*Primary Examiner* — Anthony Haughton
*Assistant Examiner* — Ingrid Wright
(74) *Attorney, Agent, or Firm* — Flyer & Flyer, a Professional Law Corporation; David R. Flyer

(57) ABSTRACT

My invention is an apparatus to cause the computer monitor or screen to slowly and automatically move either laterally toward and away from the user or upward and downward in relation to the user, so as to reduce eye strain.

2 Claims, 3 Drawing Sheets

ANTI-ACCOMMODATION PARESIS APPARATUS

CROSS-REFERENCES

Figure 1:
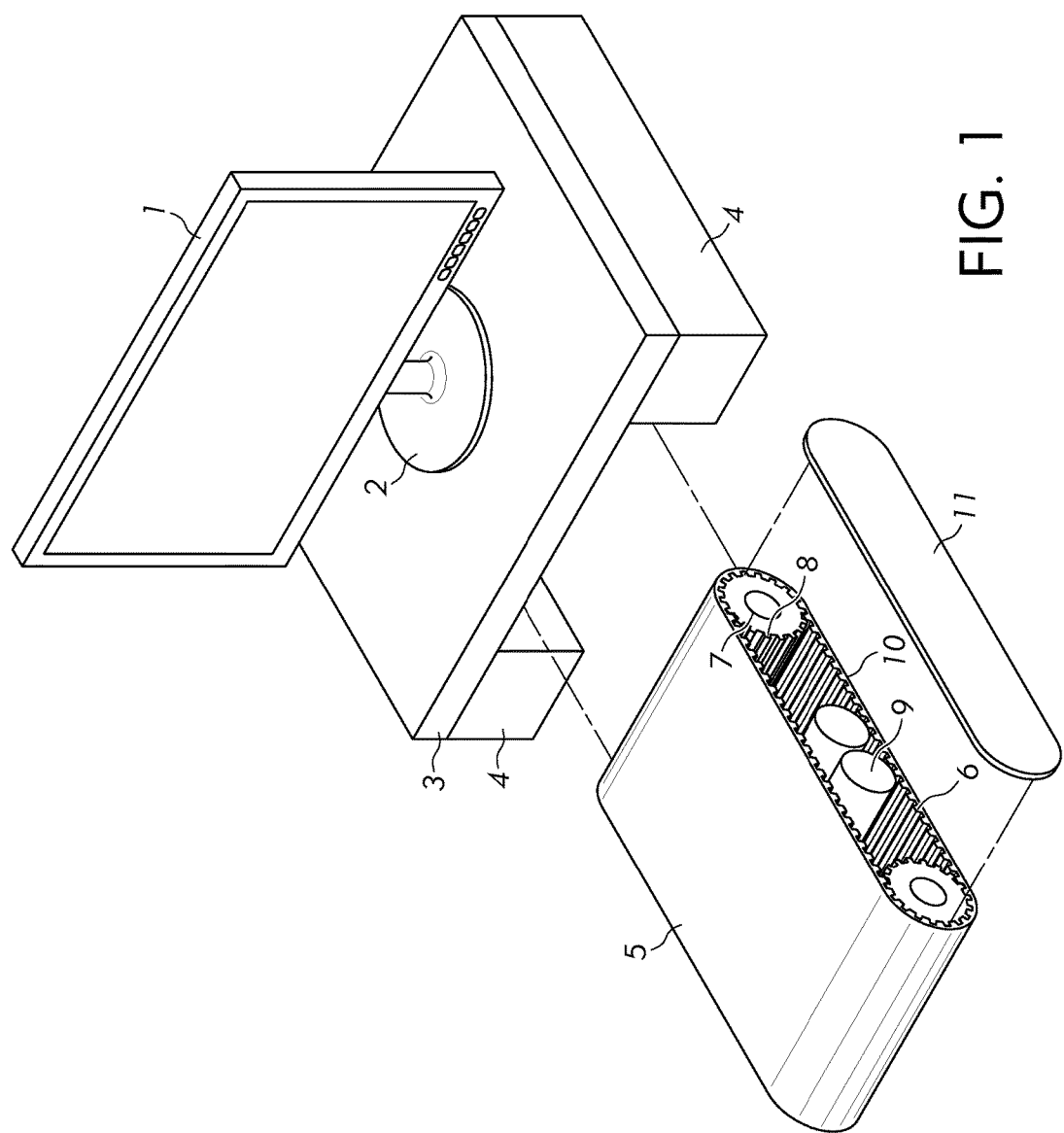

None.

STATEMENT REGARDING FEDERALLY-SPONSORED RESEARCH OR DEVELOPMENT

None.

NAMES OF PARTIES TO JOINT RESEARCH AGREEMENT

None.

REFERENCE TO "SEQUENCE LISTING"

None.

SUMMARY OF INVENTION

Out of concern for leaving an image on a computer monitor or screen for prolonged periods of time, others have invented screen savers which are randomly moving images projected onto the screen. No similar concern has resulted in providing protection for the eye of the human user. It is a well-known malady that continued viewing of images on a screen at a fixed distance for prolonged periods can cause eye soreness and weakness of the eye's ability to change focus rapidly. The eye's ability to change focus is known as accommodation. The weakness of the eye's accommodation muscles is known as paresis. My invention addresses this problem by continuously forcing the eye to change its focus, constantly contracting its muscles of accommodation. This invention will therefore "exercise" the accommodation muscles.

Accommodation is the ability of the eye to focus. The eye can focus very quickly under normal circumstances. For instance, the eye can view objects at different distances and accommodate or focus to allow for a sharp image to proceed to the brain for processing. However, prolonged viewing of an object at a fixed distance, such as a computer screen, can lead to blurry vision after looking away from that fixed distance. This physiologic phenomenon is referred to as "accommodation paresis" or the transient inability of the eye to focus secondary to staring at a fixed distance. One skilled in the art will be familiar with extensive medical research into this problem. The typical remedy is for the operator to routinely take breaks and look away at objects at a greater focal point. Further, therapy and training can improve accommodation paresis. My invention solves the problem of accommodation paresis, decreasing the likelihood of blurry vision without having to routinely look away (with the attendant loss of concentration) or the need for physical therapy.

A review of pertinent medical literature shows that there is "accommodative facility training" that can increase relative accommodation, both positive and negative, to relieve paresis symptoms. The literature indicates that there is long term beneficial effect of accommodative facility training using a dioptic flip lens technique. The flip lens technique involves placing two minus lenses and two plus lenses into a holder. The user focuses through one pair of lenses at an object at near distance. When the object is clearly in focus, a flip is performed by placing the other lenses into position. Repetition of this process of flipping lenses improves accommodative function. My invention relies to some degree on this flip lenses technique through oscillation of the screen, where the focal point is at one time near and then at another time farther away.

My invention is a mechanism that will oscillate the computer screen for a desk top or wall mounted computer, back and forth away from the user/viewer. This will continually change the user's focal distance. The purpose of the invention is to make the screen constantly but slowly move, so that the user's eyes are not staring at a fixed distance for prolonged periods. This will cause the user's eyes to continually accommodate and force the accommodation muscles to continually contract. In this manner, accommodation paresis is reduced or eliminated. The invention also minimizes the distraction of a moving screen by changing the screen distance constantly, but at a nearly imperceptibly slow rate as to not distract the user.

In one embodiment, my invention is comprised of a platform on which the screen rests. The platform is connected on a bottom side to a housing which contains several wheels that are fitted into a track. The several wheels are all engaged to turn by a single drive gear which is connected to an electric motor. When the computer is turned on, a power source from the computer starts the motor, which causes the drive gear to turn resulting in translation of the platform backward and forward from the user. The screen will move slowly enough so that the user is not consciously aware of the motion. The distance of the backward and forward motion and the time of movement over that distance can be pre-set by the computer manufacturer or the operator can customize the distance speed of oscillation. A first sensor detects when the screen is in use and commences the backward and forward translation. Similarly, when the screen is no longer in use, the sensor halts the translation process. A second sensor detects when the device has reached the end of backward motion and commands the device to reverse direction to move forward.

In preferred embodiment, the distance of travel of the screen is about six inches and the time to complete one cycle, backward and forward translation of the screen is about one hour. However, this distance and speed are amenable and may change to optimize the anti-accommodation paresis effects of the invention.

It is anticipated that the motor and track assembly can be incorporated into the overall computer design. In another embodiment, the motor and track assembly can be provided as an after-market apparatus. One skilled in the art will be able to quickly derive alternative means for connecting the invention to the screen.

DRAWINGS 2, described as follows:

FIG. 1 contains a perspective view of the monitor on a platform, which is connected to a track that moves backward and forward, causing the entire platform to move.

Figure 2:
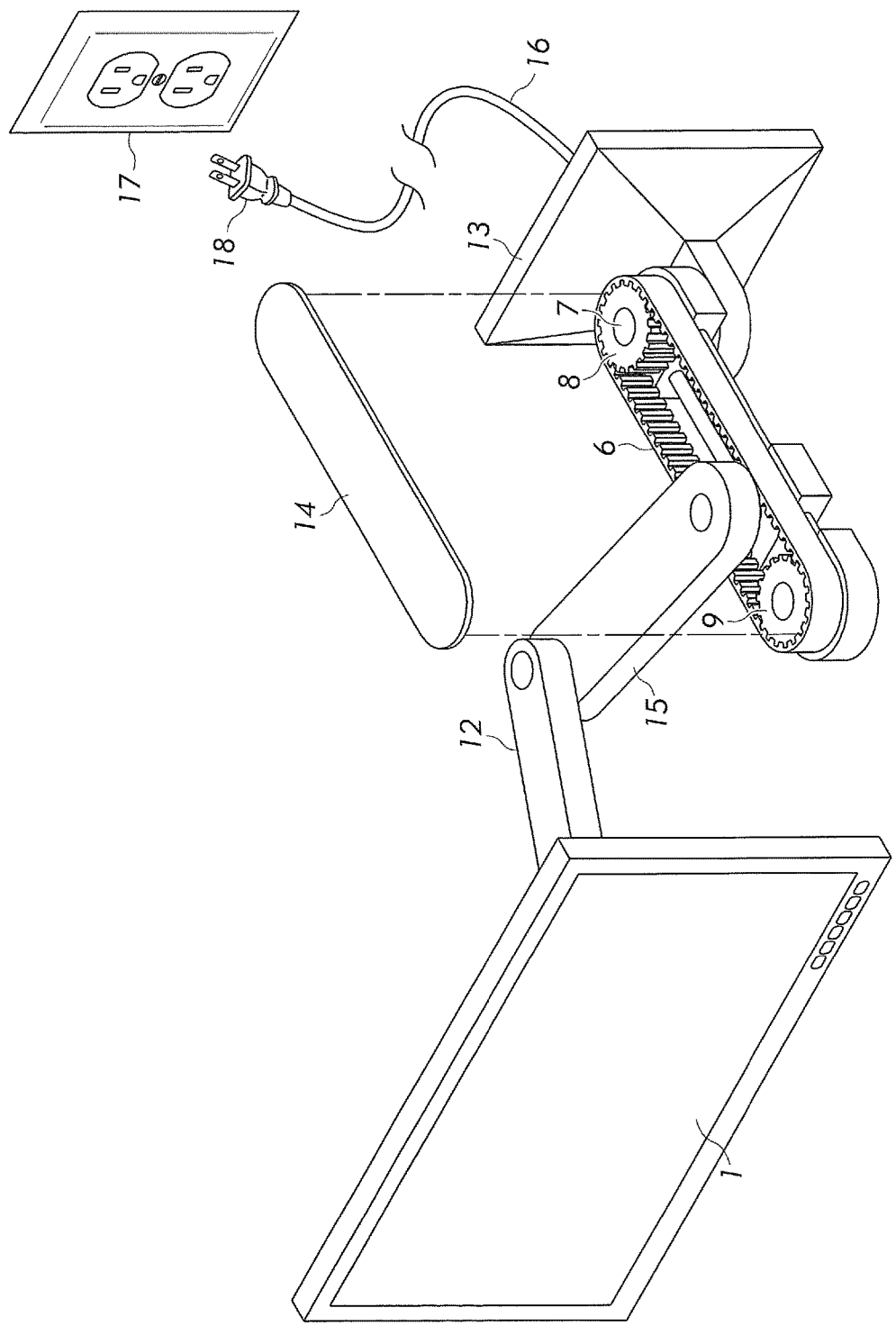

FIG. 2 contains a perspective view of a three-atm stand for a monitor, showing the connection to the track which moves the lowest atm backward and forward to cause the screen position to change.

Figure 3:
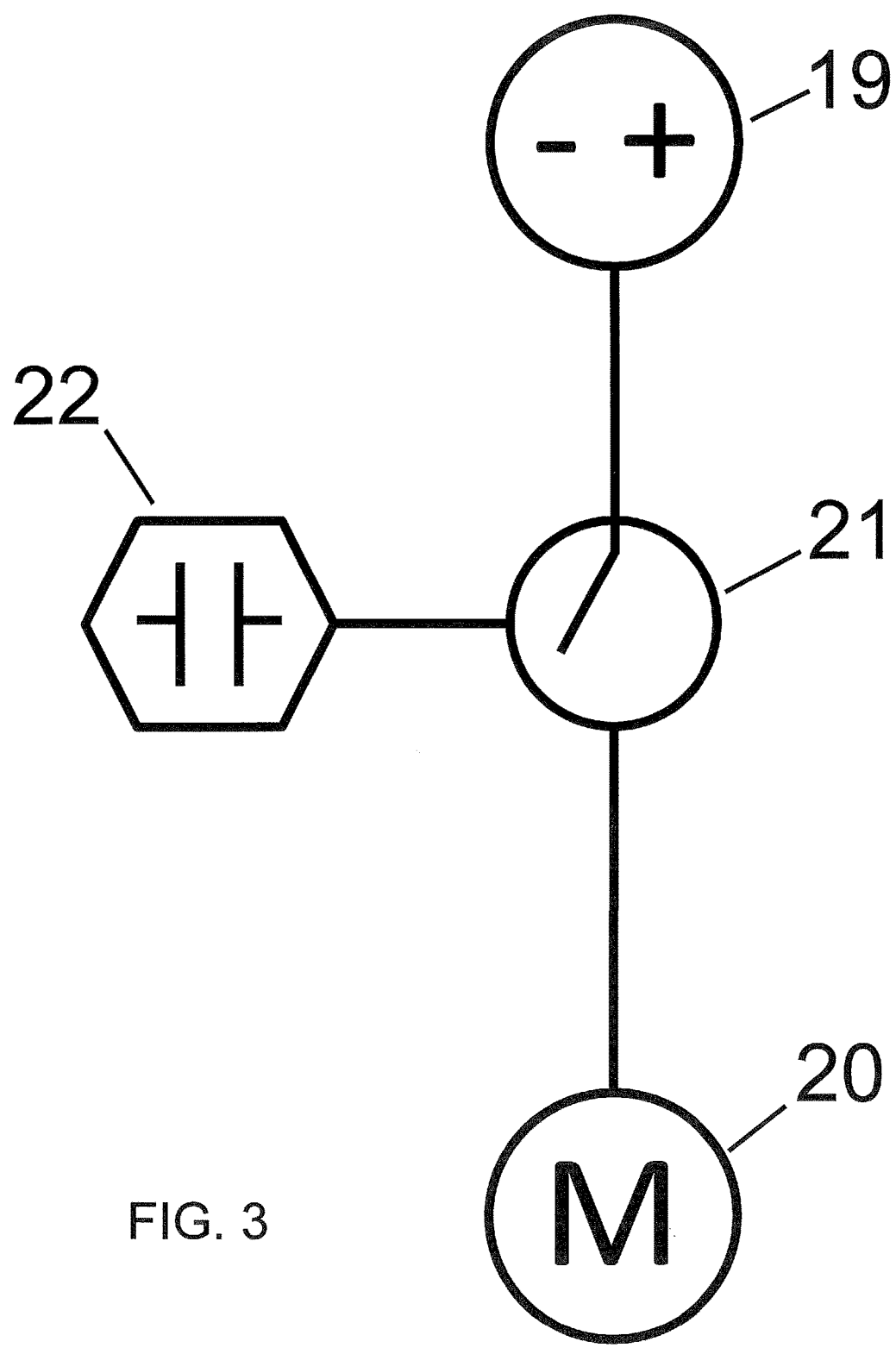

FIG. 3 contains a schematic of a means for moving the lower atm upward and downward after sensing that the screen is being used while drawing power from the computer.

DETAILED DESCRIPTION OF DRAWINGS

In FIG. 1, a computer screen1 is mounted on a platform2. The platform has a base3 and two legs4. Lodged between the legs and connected to the bottom of the platform is the top5 of a housing that moves a pre-set distance on a track10. Movement of the track is compelled by a drive wheel7. The drive wheel has cogs which engage the valleys in the track6. At least one free turning wheel9 is located on the track with the purpose of maintaining definition or shape of the track and allowing for distribution of the load. The drive wheel7 has a power source connection to the computer [not shown]. The drive wheel also has a first sensor8 which detects when a user manipulates the computer screen1, to start the process of backward and forward movement, as well as to halt the process when the screen is no longer in use. The drive wheel has a second sensor, in a proximal location, to change direction from backward to forward motion, when the track has reached the end of its permitted travel. A cover11 protects the wheel driven track assembly for purposes of safety (to avoid nip points) and for aesthetics.

In another embodiment, in FIG. 2, a screen1 for a computer is mounted on a first end of an uppermost arm12 of a three-arm device or two-atm device. The uppermost atm is connected at a second end to a first elbow joint. In the three-arm device, a middle arm15 at a first end is connected to the same elbow joint, which permits the uppermost atm to swing to allow user access at different locations. The middle arm at a second end is connected to a second elbow joint. In the two-atm device, the middle arm and the second elbow joint are eliminated. A lowest arm containing a wheel and track assembly at a first end is connected to the second elbow joint [of in the two-arm device it is connected to the first elbow joint] and at a second end is connected to a base13. In this configuration, to prevent tipping, the base is usually clamped or semi-permanently affixed to a wall or flat surface. The wheel and track assembly is defined by a drive wheel7 and at least one free turning whee19. The drive wheel has cogs which engage the valleys6 in the track so as to move the track up and down. The drive wheel7 has a power source connection16 to the computer, which power source can be internal or external. In an external embodiment, power is supplied by an electrical cord attached at a first end to a base13, and at a second end to a plug18 which can be inserted into a wall outlet17, or in an internal embodiment, power is supplied by one or more batteries, to engage a motor. The drive wheel also has a first sensor8 which detects when a user manipulates the computer screen1, to start the process of upward and downward movement, as well as to halt the process when the screen is no longer in use. In FIG. 3, a schematic shows the power source19, connected to a switch21, which closes the circuit when directed by the sensor22, to engage the motor20, that operates the drive wheel. The drive wheel has a second sensor at the same location as the first sensor to change direction from upward to downward motion, when the track has reached the end of its permitted travel. A cover14 protects the wheel driven track assembly for purposes of safety (to avoid nip points) and for aesthetics.

Other variations of the wheel driven track assembly are possible and disclosed to include: (a) at least two pulleys connected by smooth straps, where tension on the straps is increased or decreased to allow for movement of the connected platform; (b) a spring which can be slowly recoiled by pressure and then expanded; and (c) a piston which can be slowly compressed pneumatically and then released. The foregoing are alternative means for moving the computer screen either backward and forward or upward and downward.

The above description of the preferred embodiment of the present invention has been presented for the purposes of illustration and description. It is not intended to be exhaustive or to limit the invention to the precise form disclosed. Many modifications and variations are possible in light of the above teachings. It is intended that the scope of the present invention not be limited by this detailed description, but by the claims and the equivalents to the claims.

I claim:
1. An anti-accommodation paresis apparatus for a computer screen mounted on a multiple atm assembly for a wall mounted computer comprised of:
   a base with a first side that is connected to a lower arm;
   where the lower atm houses a means for moving the lower arm upward and downward after sensing that the screen is being used while drawing power from the computer; and
   where the means for moving the lower atm can also sense when use of the screen has ceased so as to stop movement of the lower arm.

2. An anti-accommodation paresis apparatus for a computer screen mounted on a multiple atm assembly for a surface mounted computer comprised of:
   a base with a first side that is connected to a lower arm;
   where the lower atm houses a means for moving the lower arm upward and downward after sensing that the screen is being used while drawing power from the computer; and
   where the means for moving the lower atm can also sense when use of the screen has ceased so as to stop movement of the lower arm.

* * * * *